STATION SELECTING MECHANISM

Filed April 17, 1970

INVENTOR
TERUZO ISHIDA
BY James and Franklin
ATTORNEY

United States Patent Office
3,618,405
Patented Nov. 9, 1971

3,618,405
STATION SELECTING MECHANISM

Teruzo Ishida, Tokyo, Japan, assignor to Alps Electric Co., Ltd., Tokyo, Japan

Filed Apr. 17, 1970, Ser. No. 29,442
Claims priority, application Japan, May 1, 1969, 44/34,236
Int. Cl. F16h *35/18*
U.S. Cl. 74—10.52 11 Claims

ABSTRACT OF THE DISCLOSURE

A station selecting mechanism, particularly well adapted for UHF reception, provides for detented coarse tuning and for fine tuning within the detented setting, the coarse tuning being accomplished through a gearing arrangement driven by a detented member and the fine tuning being accomplished by means of a cam acting on a lever carried by the detented member.

The present invention relates to station selecting mechanism providing for coarse and fine tuning, and is particularly well adapted for use in a detented UHF tuner.

In UHF television transmission there are a very large number (eighty-nine) of available channels. This contrasts with VHF reception, where only twelve channels are provided. In VHF tuners with which the public is familiar coarse tuning to a given channel is accomplished in a detented fashion, and after the detent mechanism has been set for a particular channel fine tuning of that particular channel is then carried out. The public has thus come to expect detented coarse tuning to selected a given channel, followed by fine tuning of that channel. However, because of the very number of VHF channels available, comparable tuning for VHF has thus far eluded the art for all practical purposes. To provide for coarse tuning having over eighty detented positions, and then to provide for fine tuning within each one of those detented positions, as is required in UHF tuning, and to do this with a mechanical structure which is small enough to be included in a normal-size receiver and which is inexpensive enough to be practical for use in the very cost-conscious TV tuner industry, has proved to be extremely difficult.

It is the primary object of the present invention to provide a simple, inexpensive and reliable mechanism for permitting coarse tuning and fine tuning to be accomplished, preferably by concentric shafts, and preferably with coarse tuning being detent-controlled.

To this end the coarse tuning shaft, which preferably is the inner of two concentric tuning shafts, acting through an epicyclic gear system rotates a plate member which is acted upon by a detent, the rotation of that plate being transmitted to the tuning shaft of the tuner proper. The tuning shaft (which preferably is the outer one of two concentric shafts) drives a cam which in turn actuates a lever mounted on the detented plate. This lever is operatively connected to the tuning shaft of the tuner proper, thereby to rotate the later and produce a fine tuning effect. The epicyclic gear mechanism and the cam-driven mechanism may be very compactly arranged, so that the parts take up very little space. Moreover, none of the parts need be made with any special degree of precision.

Figure 1:
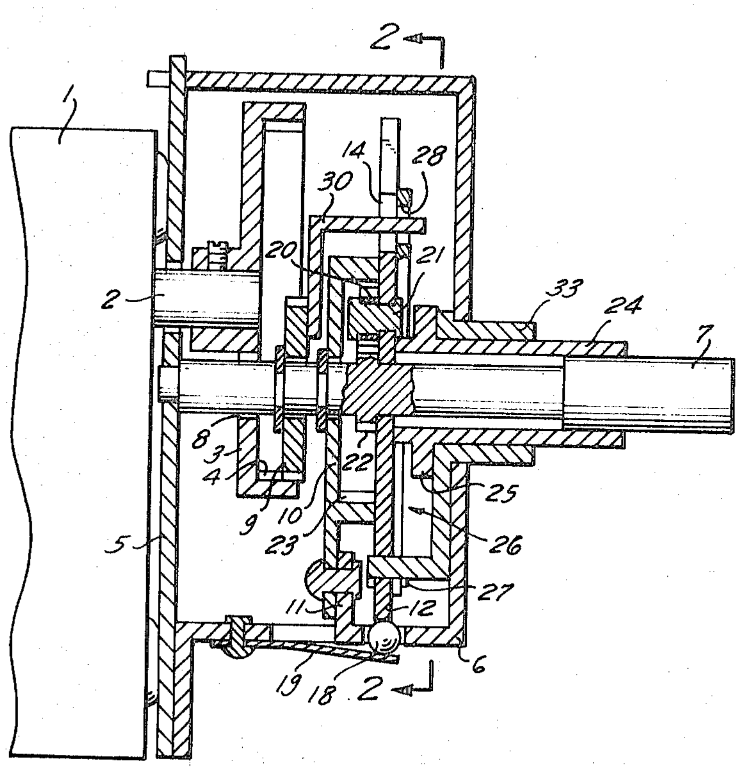
Figure 2:
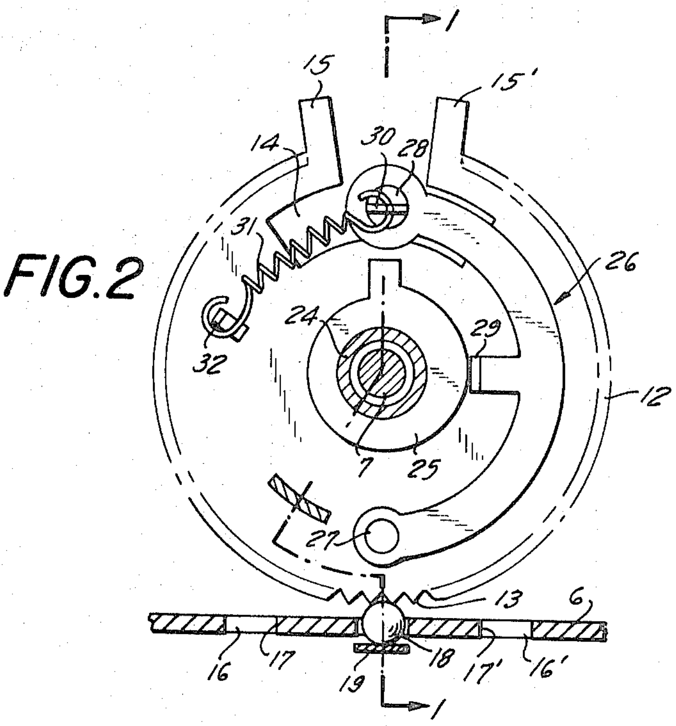

To the accomplishment of the above, and to such other objects as may hereinafter appear, the present invention relates to the construction of a station selecting mechanism for tuners as described in this specification, taken together with the accompanying drawings, in which:

FIG. 1 is a cross sectional view of the tuner assembly taken along the line 1—1 of FIG. 2; and FIG. 2 is a cross sectional view of the tuner assembly taken along the line 2—2 of FIG. 1.

The invention will be explained hereinafter with reference to an embodiment shown in the appended drawings, which comprises a UHF tuner proper 1 with a rotating turning shaft 2, a gear 3 being securely attached to the shaft 2 and having internal teeth 4. A bracket 5 is securely attached to the tuner 1, a bracket 6 is securely attached to said fitting plate 5 and has a rectangular shape with one side removed. An inner tuning shaft 7 for use in coarse adjustment is mounted in a freely rotating manner between the brackets 5 and 6, passing through an arcuate hole 8 in the gear 3. On the above mentioned shaft 7 is provided, in a freely rotatable manner, a transmission gear 9 which engages with the internal gear teeth 4 of the gear 3.

A fixed gear 10 is securely attached to the bent piece 11 of the bracket 6, whereby the gear 10 is disposed concentrically with the shaft 7.

A detent plate 12 which makes an intermittent movement is mounted in a freely rotatable manner on shaft 7 and has a serrated outer surface 13. The detent plate 12, as shown in FIG. 2, is provided with an arcuate hole 14 and stop arms 15 and 15'. When the stop arms 15 and 15' have come in contact with the edges 17 and 17', respectively, of holes 16 and 16' of the bracket 16 the detent plate 12 will not rotate any further. A ball 18 is resiliently pressed against the serrated periphery 13 of the detent plate 12 by means of a leaf spring 19, thereby causing the detent plate 12 to be ratcheted from one position to the next. There will be as many serrations in the detent periphery 13 as there are channels to be tuned. Thus for a VHF tuner there may be ninety serrations between the stop arms 15 and 15', one for each VHF channel. An epicyclic gear 20 is attached to the detent plate 12 by means of a shaft support 21. The epicyclic gear 20 is engaged with a gear 22 which is fixed to the inner shaft 7 and with the internal gear teeth 23 of the fixed gear 10. When the inner shaft 7 is rotated, the epicyclic gear 20 rotates over the internal gear teeth 23 of the fixed gear 10, thereby causing the detent plate 12 to rotate therewith.

An outer shaft 24 for use in fine adjustment is mounted in a freely rotatable manner on the inner shaft 7. It carries an eccentric cam 25 rotatable therewith. A lever 26, as shown clearly in FIG. 2, has a C-shape, with one end thereof being attached to the detent plate 12 by means of a shaft support 27. The lever 26 has a hole 28 at the other end thereof and a piece 29 extending out from the middle portion thereof for contact with the eccentric cam 25.

An L-shaped connecting element 30 has one end fixed to the transmission gear 9 while the other end passes freely through the arcuate hole 14 of the detent plate 12 and is received in the hole 28 of the lever 26. The connecting element 30, as described hereinafter, is adapted to transmit the rotating motion of the shafts 7 and 24 to the rotating shaft 2 of the UHF tuner proper 1.

A spring 31 is connected in tension between the L-shaped connecting element 30 and the hook-like piece 32 of the detent plate 12. The piece 29 of the lever 26 is thus resiliently pressed against the periphery of the eccentric cam 25.

A dial shaft 33 is rotatably mounted on the outer shaft 24, one end of that shaft being engaged with the detent plate 12 so as to be rotated simultaneously with the rotation of the latter.

The operation of the station selecting mechanism of the present invention is as follows:

As the inner shaft 7 is rotated the gear 22 causes the epicyclic gear 20 to be rotated over the internal gear teeth 23 of the fixed gear 10. The detent plate 12 is therefore rotated, being detented from one position to the next by means of the ball 18 and spring 19 acting on the serrated outer surface 13.

Furthermore, as the detent plate 12 is rotated, the lever 26 on the detent plate 12 moves with that plate. This causes the L-shaped connecting element 30 received in the hole 28 of the lever 26 to be rotated, thus rotating the transmission gear 9, which in turn rotates gear 3. Consequently, the shaft 2 of the tuner proper 1 is stepped along from one tuning position to the next, producing coarse tuning from one broadcasting channel to the next.

Also, when the detent plate 12 is rotated, the dial shaft 33 is rotated simultaneously. Thus, the indication of the channel to which the receiver is tuned may be made by means of a dial plate (not shown) fast on the above mentioned shaft 33.

For fine tuning the outer shaft 24 is rotated, which causes the eccentric cam 25 to rotate. As a result the lever 26, urged into engagement with the periphery of the eccentric cam 25 by the force of the spring 31, pivots about the axis of support 27 as determined by the peripheral configuration of the eccentric cam 25.

Then, as the lever 26 thus pivots, it carries the connecting element 30 therewith, so that the transmission gear 9 is rotated. Consequently, the rotating tuner shaft 2 is caused to make a fine rotation by means of the gear 3, thereby accomplishing a fine tuning operation.

It can be seen from the above that the present invention has at least the following advantages:

(1) The inner shaft is capable of reliably being selectively positioned in a large number of stepped positions, because the rotation of the inner shaft 7 is transmitted to the detent plate 12, the step-wise detented movement of the latter being transmitted to the tuner shaft 2 through an epicyclic gear reducing machanism.

(2) It is possible to provide a unit of simple construction with a small number of parts.

(3) It is possible to provide a unit of a compact form by making a mechanism for fine and rough adjustments which is small in size and flat in shape.

(4) The possibility of errors in the sequence of fine and rough adjustments has been eliminated as compared with conventional units wherein rough and fine adjustments are performed by the outer and inner shafts, respectively, because of the construction whereby rough adjustment is performed by the inner shaft and fine adjustment is performed by the outer shaft.

While one embodiment of the present invention has been here specifically disclosed, it will be apparent that many variations may be made therein, all within the scope of the instant invention as defined in the following claims.

I claim:

1. A station selecting mechanism comprising a frame, a main tuning shaft mounted thereon, a coarse tuning shaft mounted thereon, a fine tuning shaft mounted thereon, a rotatable member mounted thereon, detent means active on said member to detent-retain it in a selected one of a plurality of positions, an operative connection between said coarse tuning shaft and said member, an operative connection between said member and said main shaft, a cam operatively connected to said fine tuning shaft, a part articulately mounted on said member and operatively engaged with said cam, and an operative connection between said part and said main tuning shaft.

2. The station selecting mechanism of claim 1, in which said operative connection between said coarse tuning shaft and said member comprises an epicyclic gear.

3. In the station selecting mechanism of claim 2, means operatively connecting said part to said member and to said cam and effective to cause said part to move with said member when the latter rotates and to move relative to said member when said cam moves, said operative connection between said part and said main tuning shaft being sensitive to the movement of said part relative to said member.

4. The station selecting mechanism of claim 1, in which said coarse and fine tuning shafts are concentric.

5. The station selecting mechanism of claim 1, in which said coarse and fine tuning shafts are concentric and said coarse tuning shaft is inside said fine tuning shaft.

6. In the station selecting mechanism of claim 1, means operatively connecting said part to said member and to said cam and effective to cause said part to move with said member when the latter rotates and to move relative to said member when said cam moves, said operative connection between said part and said main tuning shaft being sensitive to the movement of said part relative to said member.

7. A station selecting mechanism comprising a frame, a first shaft rotatably mounted on said frame, a second shaft rotatably mounted on said frame, a member rotatably mounted on said shaft, an epicyclic gear mounted on said member, a fixed gear on said frame, a first gear drivingly connected to said first shaft and engaged with said fixed gear and said epicyclic gear, a lever pivotally mounted on said member, a second gear rotatably mounted on said first shaft, a cam operatively connected to said second shaft so as to be rotated thereby, means for urging said lever against said cam, and means for drivingly connecting said lever to said second gear.

8. The station selecting mechanism of claim 7, in which said first and second shafts are concentric.

9. The station selecting mechanism of claim 7, in which said first and second shafts are concentric, said first shaft being inside said second shaft.

10. The station selecting mechanism of claim 7, in which said epicyclic gear is mounted on one face of said member and said lever is mounted on another face of said member.

11. The station selecting mechanism of claim 10, in which said member is provided with an elongated aperture and said means for drivingly connecting said lever to said second gear passes through said aperture.

References Cited

UNITED STATES PATENTS

| | | | |
|---|---|---|---|
| 3,307,414 | 3/1967 | Naber et al. | 74—10.54 |
| 3,459,055 | 8/1969 | Sperber | 74—10.6 |

MILTON KAUFMAN, Primary Examiner

U.S. Cl. X.R.

74—104.5, 10.6